United States Patent
Nawaki

Patent Number: 5,295,109
Date of Patent: Mar. 15, 1994

[54] SEMICONDUCTOR MEMORY

[75] Inventor: Masaru Nawaki, Nara, Japan

[73] Assignee: Sharp Kabushiki Kaisha, Osaka, Japan

[21] Appl. No.: 838,104

[22] Filed: Feb. 18, 1992

[30] Foreign Application Priority Data

Jun. 21, 1991 [JP] Japan .................. 3-150551

[51] Int. Cl.⁵ .................. G11C 11/401
[52] U.S. Cl. .................. 365/222; 365/189.04
[58] Field of Search .................. 365/222, 189.04, 233

[56] References Cited

U.S. PATENT DOCUMENTS

| | | | |
|---|---|---|---|
| 4,106,108 | 8/1978 | Cislachi et al. | 365/222 |
| 4,747,082 | 5/1988 | Minato et al. | 365/222 |
| 4,958,322 | 9/1990 | Kosugi et al. | 365/222 |
| 4,972,376 | 11/1990 | Torimaru et al. | 365/222 |
| 4,984,208 | 1/1991 | Sawada et al. | 365/222 |
| 4,985,868 | 1/1991 | Nakano et al. | 365/222 |
| 5,033,026 | 7/1991 | Tsujimoto | 365/222 |

FOREIGN PATENT DOCUMENTS

56-11683 2/1981 Japan .................. 365/222

*Primary Examiner*—Eugene R. LaRoche
*Assistant Examiner*—Tan Nguyen
*Attorney, Agent, or Firm*—Morrison & Foerster

[57] ABSTRACT

A semiconductor memory is provided to which external data can be written during a self-refresh. Data thus written can be read out and examined to measure the oscillation frequency of the internal refresh oscillator There is no need to use special equipment such as a frequency counter for testing the oscillation frequency, and the oscillation frequency can be tested after chip sealing.

7 Claims, 3 Drawing Sheets

SEMICONDUCTOR MEMORY

BACKGROUND OF THE INVENTION

1. Field of the Invention

The present invention relates generally, as is indicated, to a semiconductor memory. More particularly, the present invention relates to a dynamic semiconductor memory generally known as a pseudostatic random-access memory (pseudo-SRAM), a form of dynamic random-access memory (DRAM) having a self-refresh function.

2. Description of the Prior Art

DRAMs are extensively used in various fields because they are smaller in size, have a larger capacity, and are cheaper to fabricate as compared with static random-access memories (SRAMs). However, DRAMs have the disadvantage that they need periodic refreshing in order to retain the stored contents. To cope with this disadvantage, it has been known to provide a pseudo-SRAM which is essentially a DRAM but is provided with a self-refresh function to accomplish automatic refreshing within the chip, thus enabling it to be used as if it were a SRAM.

The self-refresh operation of this pseudoSRAM will be described below with reference to FIGS. 5 and 6.

When, as shown in FIG. 6, the refresh control signal $\overline{RFSH}$ is set active (i,e., to an "L" or digital "low" state) for more than a prescribed period of time during the inactive (i,e., "H" or digital "high" state) period of the chip select signal $\overline{CE}$ disabling access to the pseudo-SRAM chip, this state is detected by a refresh controller 32 via an AND circuit 31, shown in FIG. 5. This causes a refresh oscillator 33 to generate a clock signal INTOSC having a constant cycle as shown in FIG. 6. Based on this clock signal, a refresh counter 34 sequentially generates row addresses by incrementing the count. Therefore, there is no need to input an external clock signal or address signal for refresh operations, but self-refresh can be automatically performed using the internal refresh oscillator 33 and refresh counter 34, thus enabling the DRAM to be used like an SRAM by just manipulating the refresh control signal $\overline{RFSH}$.

Further, while the self-refresh is being performed, since a NAND circuit 36 is masked via a buffer 35 by the chip select signal $\overline{CE}$, write to a memory cell array 37 is inhibited regardless of the state of the write enable signal $\overline{WE}$. Since a NAND circuit 38 is also masked via the buffer 35, the output enable signal $\overline{OE}$ is also disregarded.

The refresh oscillator 33 is usually formed from a ring oscillator consisting of an odd number of inverters connected in a loop form. However, with the refresh oscillator 33 of this type, there is a possibility that the oscillation frequency may vary due to variations in the process conditions of semiconductor fabrication. Therefore, in the prior art semiconductor fabrication process, it has been practiced to provide a test pad on the pseudo-SRAM chip, to directly measure the frequency of the refresh oscillator 33 and to correct any improper deviation of the oscillation frequency by a laser blow or other technique.

The refresh oscillator 33 of the above construction has the further problem that the frequency may also vary or the circuit itself may be damaged during the process of sealing the chip with resin molding. However, once the chip has been sealed with resin molding, it is no longer possible to directly measure the frequency via the test pad, and failure detection can only be achieved indirectly by read/write tests or other methods. Another disadvantage in the prior art is that since an ordinary memory tester is not equipped with a frequency counter, extra measuring equipment is required during pseudo-SRAM fabrication, even when testing the oscillation frequency via the test pad before chip sealing.

In view of the above problems, there is a strong need in the art for a semiconductor memory that can permit the writing of external data even at the time of self-refresh and thereby enables the oscillation frequency of the refresh oscillator to be tested even after chip sealing.

The present invention overcomes the aforementioned shortcomings of the above known pseudo-SRAMs. The present invention is summarized and described in detail below.

SUMMARY OF THE INVENTION

According to one aspect of the present invention, a semiconductor memory in the form of a dynamic semiconductor memory is provided in which self-refresh is performed during the active period of a refresh control signal by using the addresses sequentially generated by an internal refresh oscillator and address counter, the semiconductor memory comprising a refresh-write means that is activated by an external signal at the time of self-refresh and enables input of write data through a data input circuit.

In accordance with one embodiment of the present invention, the contents of the memory cells are initialized by a usual write operation, for example, and then, self-refresh is performed for a period not longer than one cycle. For the self-refresh, the refresh-write means enables inputs of write data through the data input circuit, and prescribed data is supplied externally to the circuit. Accordingly, the refreshing is done only on the memory cells corresponding to the addresses generated by the internal address counter during that period. Furthermore, the data written in each memory cell as a result of the self-refresh is not the initial contents of the memory cell but the prescribed data externally supplied. After the self-refresh is completed, the contents of all the memory cells are read out by a usual read operation, to examine up to which memory cell the prescribed data has been written to. This provides the information as to the number of addresses generated by the address counter during the self-refresh period, thus making it possible to measure the oscillation frequency of the internal refresh oscillator.

As a result, according to the present invention, the oscillation frequency of the refresh oscillator can be measured just by performing the write operation by the refresh-write means and a usual read operation, without having to extract the oscillation frequency of the refresh oscillator via a test pad or the like. Thus, the construction of the invention not only eliminates the need for special measuring equipment such as a frequency counter but enables the frequency to be tested easily even after chip sealing.

To the accomplishment of the foregoing and related ends, the invention, then, comprises the features hereinafter fully described and particularly pointed out in the claims.

BRIEF DESCRIPTION OF THE DRAWINGS

The present invention may be better understood and its numerous objects and advantages will become apparent to those skilled in the art by reference to the accompanying drawings as follows:

FIG. 3 is a memory map showing the initialized memory cell contents in the above embodiment.

FIG. 4 is a memory map showing the memory cell contents after self-refresh in the above embodiment.

DESCRIPTION OF THE PREFERRED EMBODIMENTS

Figure 1:
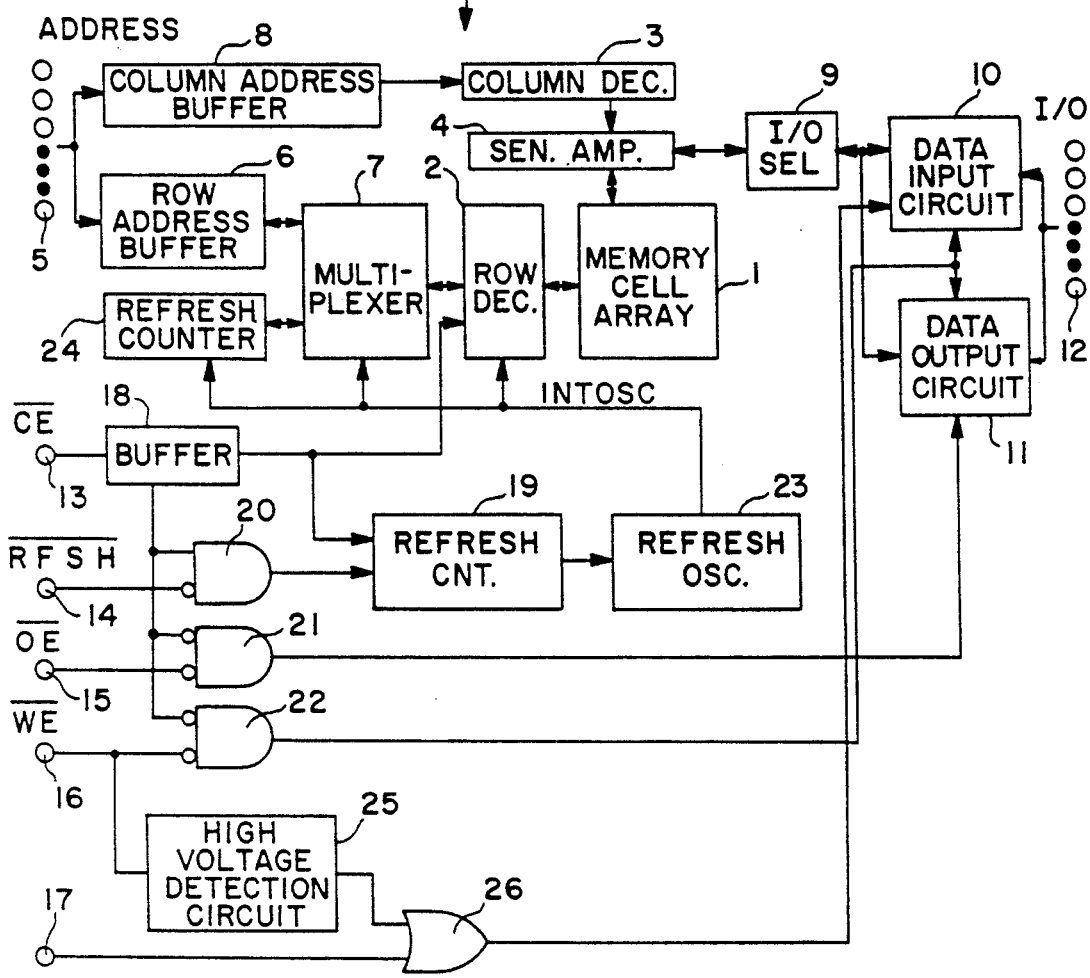
FIG. 1 is a block diagram showing the internal configuration of a pseudo-SRAM in accordance with one embodiment of the present invention.

The preferred embodiments of the present invention will now be described below with reference to the drawings wherein like reference numerals refer to like elements throughout.

FIG. 1 shows one embodiment of the invention. As shown in FIG. 1, the pseudo-SRAM 1' of this embodiment comprises a dynamic memory cell array 1, a row decoder 2 and a column decoder 3 for selecting a particular memory cell in the memory cell array 1, and a sense amplifier 4. The row decoder 2 is a circuit that receives a row address from an address terminal 5 via a row address buffer 6 and a multiplexer 7 and selects the desired word line in the memory cell array 1 by decoding the row address. A column decoder 3 is a circuit that receives a column address from the address terminal 5 via a column address buffer 8 and selects the desired bit line in the memory cell array 1 by decoding the column address. The sense amplifier 4 is an amplifier used to read data from or write data to the selected memory cell and is connected to a data input circuit 10 and a data output circuit 11 via an I/O selector 9. The data input circuit 10 and the data output circuit 11 are connected to an I/O terminal 12 for gating the data input/output.

In addition to the address terminal 5 and the I/O terminal 12, a chip select terminal 13, a refresh control terminal 14, an output enable terminal 15, a write enable terminal 16, and a test pad 17 are provided in the pseudo-SRAM. The chip select terminal 13 is a terminal to which the chip select signal $\overline{CE}$ issued for accessing the pseudo-SRAM is applied, and the chip select signal $\overline{CE}$ is supplied through a buffer 18 to the row decoder 2, the column decoder 3 (connection not shown), a refresh controller 19, etc. The chip select signal $\overline{CE}$ is also supplied through the buffer 18 to an AND circuit 20, a NAND circuit 21, and a NAND circuit 22 to control their gates.

The refresh control terminal 14 is a terminal to which the refresh control signal $\overline{RFSH}$ that is set active (L) for self-refresh to be applied. When the chip select signal $\overline{CE}$ is inactive (H), the refresh control signal $\overline{RFSH}$ is sent to the refresh controller 19 through an AND circuit 20. The refresh controller 19 is a circuit which activates a refresh oscillator 23 for a refresh operation when the chip select signal $\overline{CE}$ is inactive and the refresh control signal $\overline{RFSH}$ is active. The refresh oscillator 23 is formed from a ring oscillator consisting of an odd number of inverters connected in a loop form, and consequently, there is a possibility that the oscillation frequency may vary due to variations in the process conditions of semiconductor fabrication or during the sealing process. The clock signal INTOSC generated by the refresh oscillator 23 is delivered to the refresh counter 24, the multiplexer 7, etc. The refresh counter 24 is an address counter that sequentially increments the count by the clock signal INTOSC, to sequentially generate all the row addresses of the memory cell array 1. The addresses thus generated by the refresh counter 24 are supplied through the multiplexer 7 to the row decoder 2 for a self-refresh operation.

The output enable terminal 15 and the writ enable terminal 16 are terminals to which the output enable signal $\overline{OE}$ and the write enable signal $\overline{WE}$ are applied, respectively, in order to set the pseudo-SRAM in read or write modes. These signals are supplied through a NAND circuit 21 and a NAND circuit 22 to the data output circuit 11 and the data input circuit 10, respectively, when the chip select signal $\overline{CE}$ is set active (L). Normally, i.e. when the chip select signal $\overline{CE}$ is not active, the gates of the data input circuit 10 and the data output circuit 11 are closed to inhibit external data read or write via the I/O terminal 12 regardless of the state of the output enable signal $\overline{OE}$ or the write enable signal $\overline{WE}$. In this situation, data in each memory cell is refreshed also during self-refresh.

The write enable terminal 16 is also connected to a high voltage detection circuit 25. The high voltage detection circuit 25 is provided to detect the state when the write enable signal $\overline{WE}$ is raised to a voltage higher than the normal H state, and, when this higher voltage state is detected, to open the gate of the data input circuit 10 by means of an OR circuit 26 to enable external data write via the I/O terminal 12. Therefore, by applying a special high voltage to the write enable terminal 16, the output of the high voltage detection circuit 25 will go from logic low to high and data can also be written in during self-refresh. Data write during self-refresh can also be achieved by applying an H level to the test pad 17 and thereby opening the gate of the data input circuit 10 by means of the OR circuit 26. Thus, data can be written during self-refresh by using the test pad 17 before chip sealing and the write enable terminal 16 after chip sealing. In this embodiment, the write enable terminal 16 is used to enable data write during self-refresh, but there is no particular reason for using this particular terminal, and an other terminal, for example, the output enable terminal 15, may be used to achieve the purpose.

We will now describe the procedure for measuring the oscillation frequency of the refresh oscillator 23 of the above configured pseudo-SRAM 1'.

First, the chip select signal $\overline{CE}$ and the write enable signal $\overline{WE}$ are both set active. In this state, all the addresses of the memory cell array 1 are sequentially input to the address terminal 5 while applying data "0" to the I/O terminal 12. A usual write operation is thus performed, and the data in all the memory cells of the memory cell array 1 are initialized to "0" as shown in FIG. 3.

Figure 2:
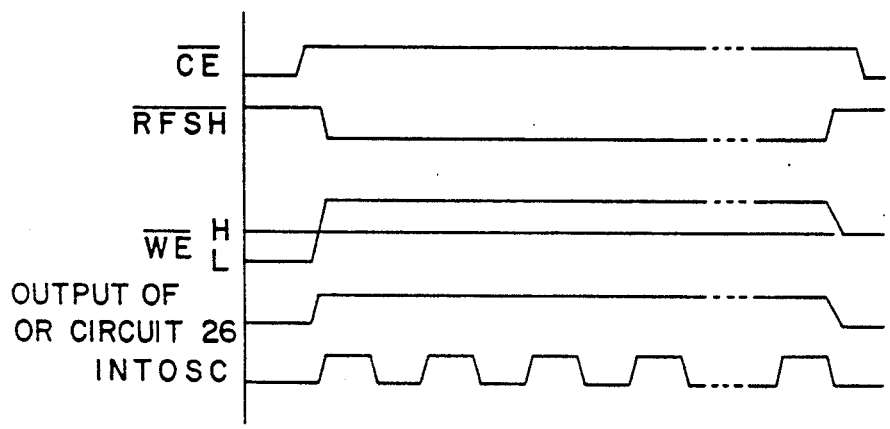
FIG. 2 is a timing chart illustrating the state of each signal during self-refreshing in the above embodiment.
Figure 5:
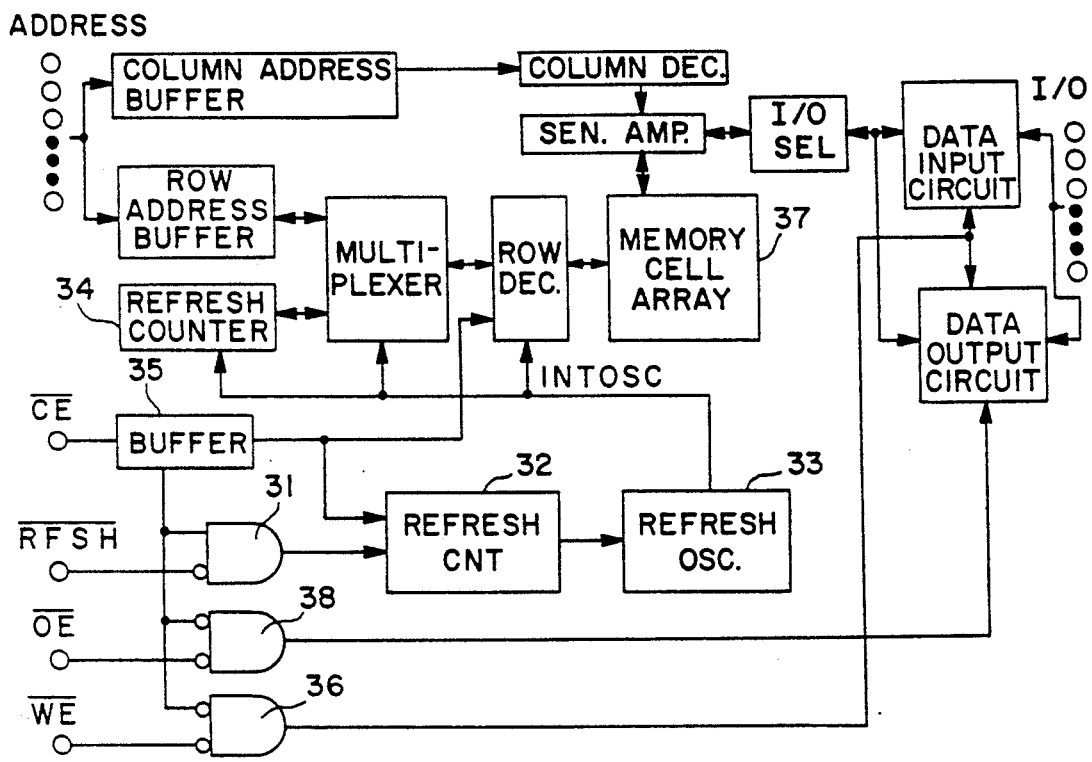
FIG. 5 is a block diagram showing the internal configuration of a prior art pseudo-SRAM.
Figure 6:
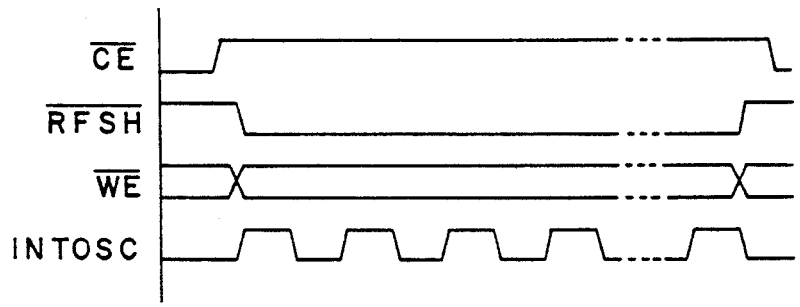
FIG. 6 is a timing chart illustrating the state of each signal during self-refreshing in the prior art pseudo-SRAM.

Next, when the chip select signal $\overline{CE}$ is set inactive (H) and the refresh control signal $\overline{RFSH}$ is set active (L), as shown in FIG. 2, the clock signal INTOSC is issued from the refresh oscillator 23, causing the refresh counter 24 to generate row addresses sequentially to perform self-refresh. At the same time, a special high voltage is applied to the write enable terminal 16, setting the output of the OR circuit 26 to an H level to open the gate of the data input circuit 10, while data "1" is applied to the I/O terminal 12. Accordingly, the initially stored data in the memory cells are replaced by the input data as a result of the self-refresh. If the process is before chip sealing, an H level may be applied to the test pad 17, rather than using the write enable terminal 16.

Figures 3, 4:
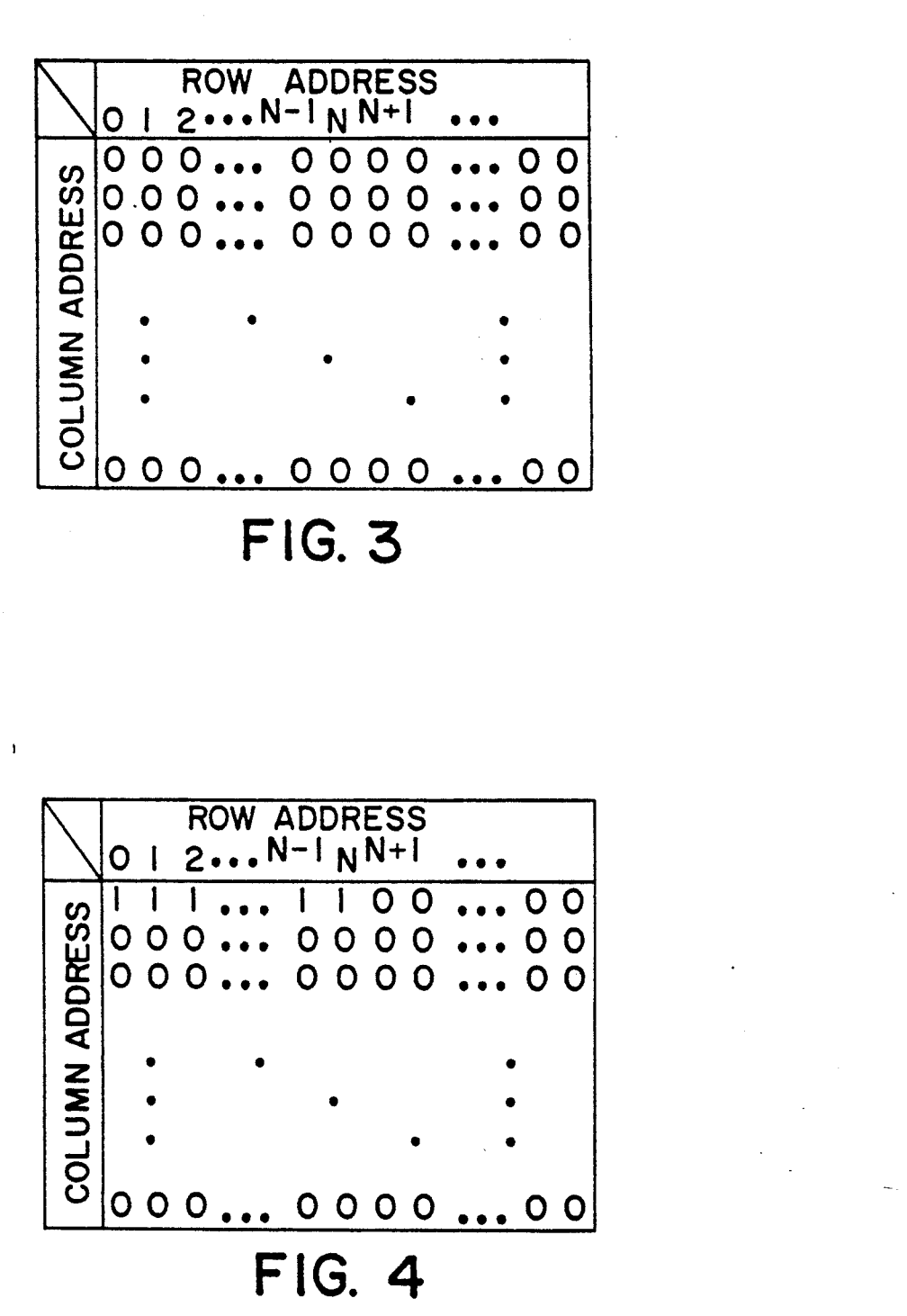

When self-refresh is performed for a period T shorter than one cycle of the refresh counter 24 while writing data "1" as described above, the data in the memory cells corresponding to the row addresses 0 - N generated by the refresh counter 24 during that period are replaced by the new data "1", as shown in FIG. 4.

After the self-refresh is completed, the data in all the memory cells in the memory cell array 1 are read out by a usual read operation, to count the number of row addresses (N+1) at which the data "1" has been written. The oscillation frequency of the refresh oscillator 23 can be measured by dividing the number (N+1) by the self-refresh period T.

Thus, according to the present embodiment, testing the oscillation frequency of the refresh oscillator 23 does not require any special equipment such as a frequency counter, and furthermore, the frequency can be checked easily even after chip sealing by using the pins on the write enable terminal 16.

As described above, according to the semiconductor memory of the present invention, external data write is enabled during self-refresh and the data thus written are read out and examined to measure the oscillation frequency of the internal refresh oscillator. As a result, there is no need to use special equipment such as a frequency counter for testing the frequency, and furthermore, the frequency can be tested easily even after chip sealing.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for providing self-refresh in a dynamic semiconductor memory having a plurality of memory cells and in which self-refresh is performed during the active period of a refresh control signal, said method comprising a step of:
   refreshing previously stored contents of said memory cells when new input data is not written to said memory cells during self-refresh, and refreshing said memory cells with said new input data in place of said previously stored contents when said new input data is written to said memory cells during self-refresh.

2. The method of claim 1, further including a step of providing self-refresh by using addresses sequentially generated by an internal refresh oscillator and address counter.

3. The method of claim 2, further including the steps of writing said new input data to said memory cells during a self-refresh of predetermined duration, and thereafter reading the data from said memory in order to determine the frequency of said internal refresh oscillator.

4. A dynamic semiconductor memory in which self-refresh is performed during the active period of a refresh control signal by using addresses sequentially generated by an internal refresh oscillator and address counter, comprising:
   refresh-write means for enabling input of write data through a data input circuit during said self-refresh, wherein said refresh-write means is activated by an external signal applied during said self-refresh, and wherein said refresh-write means comprise high voltage detection means for detecting when said external signal is raised to a higher than normal voltage state and, upon said detection, providing a write enable signal to said data input circuit.

5. The memory of claim 4, wherein said external signal comprises at least one of an external write enable signal and external output enable signal provided to said memory.

6. A dynamic semiconductor memory in which self-refresh is performed during the active period of a refresh control signal by using addresses sequentially generated by an internal refresh oscillator and address counter, comprising:
   refresh-write means for enabling input of write data through a data input circuit during said self-refresh, and
   means for determining the oscillation frequency of said refresh oscillator as a function of data written to said memory during said self-refresh.

7. A method for providing self-refresh in a dynamic semiconductor memory having a plurality of memory cells and in which self-refresh is performed during the active period of a refresh control signal, said method comprising:
   a step of refreshing previously stored contents of said memory cells when new input data is not written to said memory cells during self-refresh, and refreshing said memory cells with said new input data in place of said previously stored contents when said new input data is written to said memory cells during self-refresh,
   a step of providing self-refresh by using addresses sequentially generated by an internal refresh oscillator and address counter, and
   a step of writing said new input data to said memory cells during a self-refresh of predetermined duration, and thereafter reading the data from said memory in order to determine the frequency of said internal refresh oscillator.

* * * * *